United States Patent [19]

Garrity et al.

[11] Patent Number: 5,625,360
[45] Date of Patent: Apr. 29, 1997

[54] CURRENT SOURCE FOR REDUCING NOISE GLITCHES GENERATED IN A DIGITAL TO ANALOG CONVERTER AND METHOD THEREFOR

[75] Inventors: Douglas A. Garrity, Gilbert, Ariz.; Patrick L. Rakers, Schaumburg, Ill.

[73] Assignee: Motorola, Inc., Schaumburg, Ill.

[21] Appl. No.: 524,095

[22] Filed: Sep. 5, 1995

[51] Int. Cl.$^6$ .................................................. H03M 1/66
[52] U.S. Cl. ........................................................ 341/144
[58] Field of Search .................................. 341/144, 154, 341/131; 375/320; 327/132

[56] References Cited

U.S. PATENT DOCUMENTS 4,422,176 12/1983 Summers .................................. 375/120

OTHER PUBLICATIONS

"A 16–b D/A Converter with Increased Spurious Free Dynamic Range", IEEE Journal of Solid–State Circuits, vol. 29, No. 10, Oct. 1994.

Primary Examiner—Brian K. Young
Attorney, Agent, or Firm—Gary W. Hoshizaki; Sharon K. Coleman

[57] ABSTRACT

A switchable current source (41) for a Digital to Analog Converter (DAC) to reduce noise glitches when a change in total current provided by the DAC occurs. The switchable current source (41) is one of many required by a DAC to convert a digital signal to an analog signal. Each current source of the DAC receives an input voltage that enables or disables the current source from providing or not providing a current. A sampled input voltage is alternately provided to the switchable current source (41) by a first flip flop (42) or a second flip flop (43). One flip flop samples the input voltage while the other provides a previous sampled input voltage for enabling and disabling the switchable current source (41). Switches (46,47) couple an output voltage of the first or second flip flops (42,43) a predetermined time after the output voltage changes to a transistor (51) coupled to a current source (53).

18 Claims, 3 Drawing Sheets

CURRENT SOURCE FOR REDUCING NOISE GLITCHES GENERATED IN A DIGITAL TO ANALOG CONVERTER AND METHOD THEREFOR

BACKGROUND OF THE INVENTION

This invention relates, in general, to Digital to Analog Converters (DACs), and more particularly, to a switchable current source for reducing noise glitches in a Digital to Analog Converter.

A Digital to Analog Converter (DAC) is an electronic circuit that converts a digital signal to an analog signal. In general, a numerical value of the digital signal input to a DAC corresponds to a magnitude of the analog signal output by the DAC. The speed of at which a DAC converts a digital signal to a stable analog signal is an important parameter for many circuit applications. A second factor is the resolution of a DAC. The resolution of a DAC is the smallest incremental signal that is generated and corresponds to the Least Significant Bit (LSB) of an input digital signal. A third factor is noise generated by a DAC as a conversion takes place.

One area that utilizes high speed, high resolution, Digital to Analog Converters is the communication industry, for example, cellular phones. High frequency glitches generated by a DAC produce spurs or distortion that can be received by other communication circuits which could produce errors in reception. The high frequency glitches are generated as the DAC produces an output signal change. In general, the high frequency glitches are produced by delay differences between the individual circuits that produce voltages or currents that are summed together to generate the analog output signal. Spurious free dynamic range is a measure of glitch caused distortion that is specified for DACs used in these types of applications to reduce reception errors.

It would be of great benefit if a switchable current source could be provided for reducing noise generated by a Digital to Analog Converter.

DETAILED DESCRIPTION OF THE DRAWINGS

Figure 1:
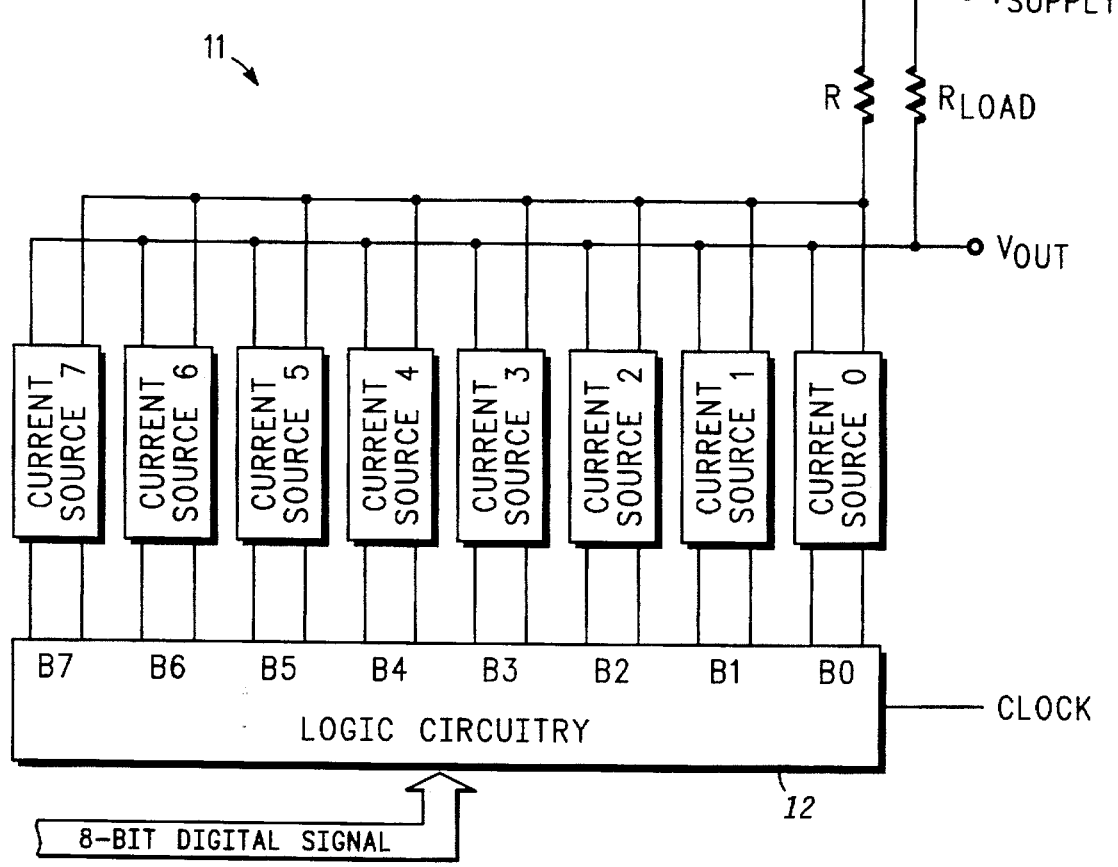
FIG. 1 is a simplified block diagram illustrating a DAC comprising ratioed current sources.

Glitches generated by a high speed Digital to Analog Converter (DAC) as a digital signal is converted to an analog signal are of sufficient magnitude and frequency to significantly degrade the usable dynamic range of the communication system in which the DAC is incorporated. In particular, DACs operating at high speeds, for example, greater than 50 megahertz convert a digital signal to an analog signal in less than 20 nanoseconds. High speed DACs are often used in communication circuits such as a cellular phone. Communication circuits have receiver circuits sensitive to signals of particular frequencies. High frequency glitches are generated by a DAC during a voltage conversion process due to delay differences in the circuitry providing incremental voltages or currents that are summed to form the analog signal. Harmonics of the glitches extend over a wide range of frequencies produced by the DAC. The high frequency harmonics generated by the DAC can be received by other communication circuitry which could produce errors or distortion in reception. Due to the impact on other communication circuitry, transmitted glitch generated distortion from a DAC is not tolerated and must meet rigid standards.

One type of high speed, high resolution DAC employs ratioed current sources that can be enabled or disabled from providing a current. The current sources have current magnitudes a predetermined ratio to one another, typically, the ratio of the current magnitudes is binary wherein each digit of a digital signal corresponds to a current source of the DAC. A digital signal applied to the DAC enables or disables current sources of the DAC from providing current such that a total current or summed current of the current sources corresponds to a magnitude of the digital signal. The summed current is coupled to a resistor load to produce a voltage corresponding to the magnitude of the digital signal. In practice, the current sources cannot be enabled and disabled simultaneously due to delay path differences in the circuitry. An output glitch is produced when the current output switches since there is always asymmetry in bit turn on and turn off speeds. For example, one worst case transition of a 10 bit DAC occurs when an input digital signal changes from 1000000000 to 0111111111. The difference in magnitude between the two digital signals is the smallest increment (Least Significant Bit) which corresponds to a change in current of the smallest magnitude current source. Yet, the difference in delay in enabling and disabling current sources (all the current sources change state) in the 10 bit DAC results in the output of a DAC changing voltage (either positive or negative) until all the current sources have completely switched. The resulting output signal produces a glitch which results in a noise spur in the output frequency spectrum that is dependent on the applied digital signal. In particular, glitches in the output signal produce harmonic distortion and other non-harmonic spurs in the DAC output spectrum.

FIG. 1 is a simplified block diagram for describing operation of a DAC 11. DAC 11 utilizes ratioed or weighted current sources for converting a digital signal to an analog signal as is well known by one skilled in the art. DAC 11 is illustrated as an eight bit DAC, comprising logic circuitry 12, current sources 0–7, and resistors R and Rload. DAC 11 has an input for receiving an eight bit digital signal and an output for providing a voltage having a magnitude corresponding to the digital signal.

Logic circuitry 12 receives the eight bit digital signal and provides control signals at outputs B0–B7 for respectively enabling and disabling current sources 0–7. Typically, DAC 11 is clocked such that logic circuitry 12 provides new control signals at predetermined intervals.

Current sources 0–7 are ratioed or weighted to each other. For example, current source 0 represents a Least Significant Bit (LSB) of the digital signal. Current source 0 has the smallest magnitude current of the current sources of DAC 11. Current sources 1–7 are a predetermined ratio of the current magnitude of current source 0. In a binary weighted system, current sources 1–7 respectively have 2, 4, 8, 16, 32, 64, and 128 times the current magnitude of current source 0.

Control signals B0–B7 respectively enable current sources 0–7 for providing current to either resistor R or resistor Rload. A current source providing current to resistor R is "disabled" or diverted from supplying current to Rload. Diverting the current is much faster than turning a current source on and off. The current provided to resistor Rload generates a voltage at output Vout that corresponds to the magnitude of the digital signal applied at the input of DAC 11.

Even though DAC 11 is clocked, delay differences due to the physical layout of the circuitry create noise glitches as current sources 0–7 are enabled and disabled by logic circuitry 12. For example, assume current source 7 is being disabled or diverted from providing current to Rload and current source 6 is being enabled for providing current to Rload. Both current source 6 and 7 are respectively enabled and disabled simultaneously by the logic circuitry but delay differences may cause current source 7 to be disabled slightly after current source 6 is enabled. The output Vout will increase in magnitude as both current sources 6 and 7 are enabled and then rapidly decrease as current source 7 is disabled. Noise glitches occur at the output Vout as current sources 0–7 are enabled and disabled at different times due to delay differences. The noise glitching occurs at high speed producing fast voltage transitions. As mentioned previously, the noise glitches at the output Vout produce high frequency harmonic distortion and other non-harmonic spurs that is transmitted and can be received by other communication circuitry that could produce reception errors. The magnitude of the noise spurs is dependent on the previous digital signal and the digital signal being applied.

Figure 2:
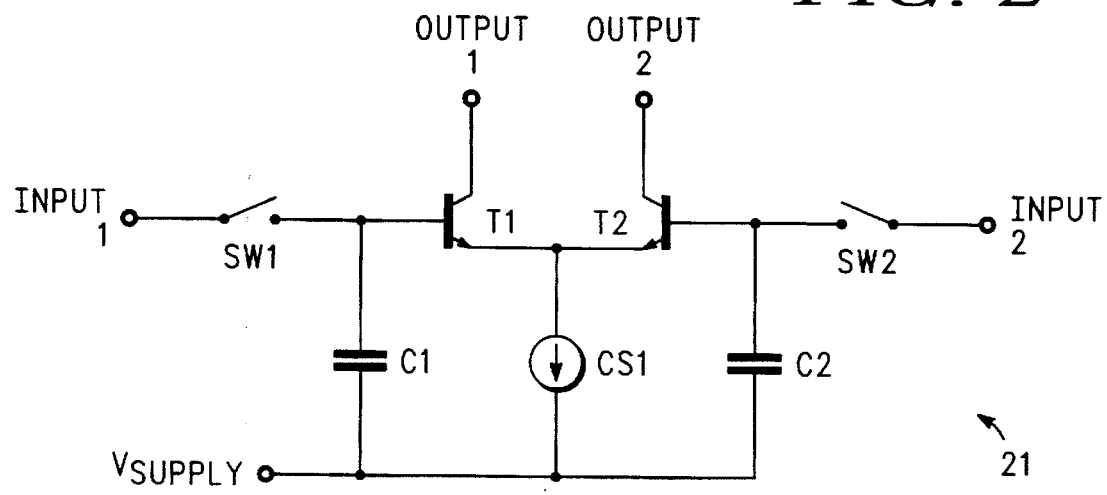
FIG. 2 is a prior art schematic diagram of current source including switches for reducing noise glitches.

FIG. 2 is a prior art schematic diagram of a switched differential current source 11 commonly used in a DAC that is switched for reducing noise spurs. Current source 11 comprises a differential transistor pair (T1, T2), a current source (CS1), and switches (SW1, SW2). Capacitances C1 and C2 are parasitic capacitances that couple between the inputs of the differential transistor pair and voltage supply terminal (Vsupply). A differential voltage is applied across an Input1 and an Input2 to divert current through one transistor of the differential transistor pair. Switches SW1 and SW2 respectively couple voltages at Input1 and Input2 to a base of transistor T1 and transistor T2. Noise is reduced by leaving switches (SW1, SW2) open until the voltages at Input1 and Input2 have stabilized and then closing the switches.

Referring to FIG. 1, more than one current source is used in a DAC, each current source is configured as shown in FIG. 2 to reduce noise. Noise glitches are reduced in a DAC by waiting until the inputs of each current source has stabilized and then coupling the inputs (via switches as shown in FIG. 2) to a corresponding differential transistor pair. The switches of each current source must be open until the last input voltage of the current sources has stabilized. The switches of each current source are then closed simultaneously with one another to generate a summed current. The prior art approach does not couple a changing input voltage to a corresponding current source until the input voltage has stabilized.

Figure 3:
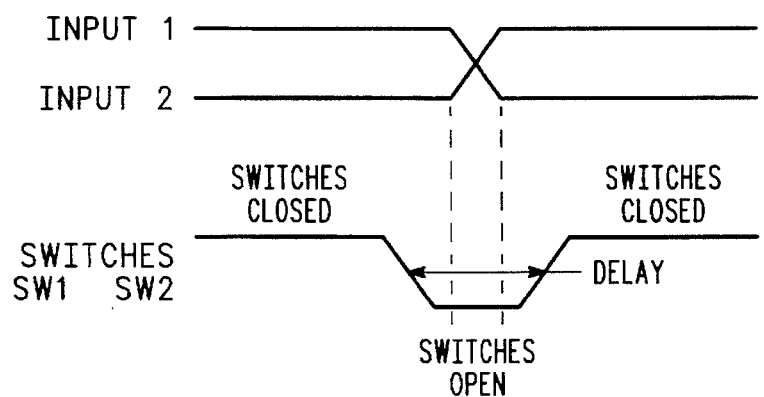
FIG. 3 is a timing diagram illustrating the timing of the switches of FIG. 2.

FIG. 3 is a timing diagram illustrating voltages applied to Input1 and Input2 (FIG. 2) and the timing of switches SW1 and SW2. Switches SW1 and SW2 are opened before the voltages at Input1 and Input2 change. Thus, decoupling Input1 and Input2 from the differential transistor pair. The switches are opened for a period of time to insure input voltages have stabilized. A timing circuit is required for enabling and disabling the switches. Changes to the circuit due to temperature or wafer process variations must be taken into account in determining a worst case delay for holding switches open. Parasitic capacitance C1 and C2 (FIG. 2) is used to maintain input voltages to transistors T1 and T2 (FIG. 2) when switches SW1 and SW2 are open. Parasitic capacitance C1 and C2 have a small capacitance value such that leakage currents could drain the charge stored thereon if the delay for maintaining the switches opened is substantial.

The technique described hereinabove, the associated problem of noise glitches, and a DAC implementing the technique is described in a paper by Douglas Mercer, titled "A 16B D/A Converter with Increased Spurious Free Dynamic Range", published in the I.E.E.E. Journal of Solid State Circuits, Vol. 29, No. 10, on October 1994 which is hereby incorporated by reference.

Figure 4:
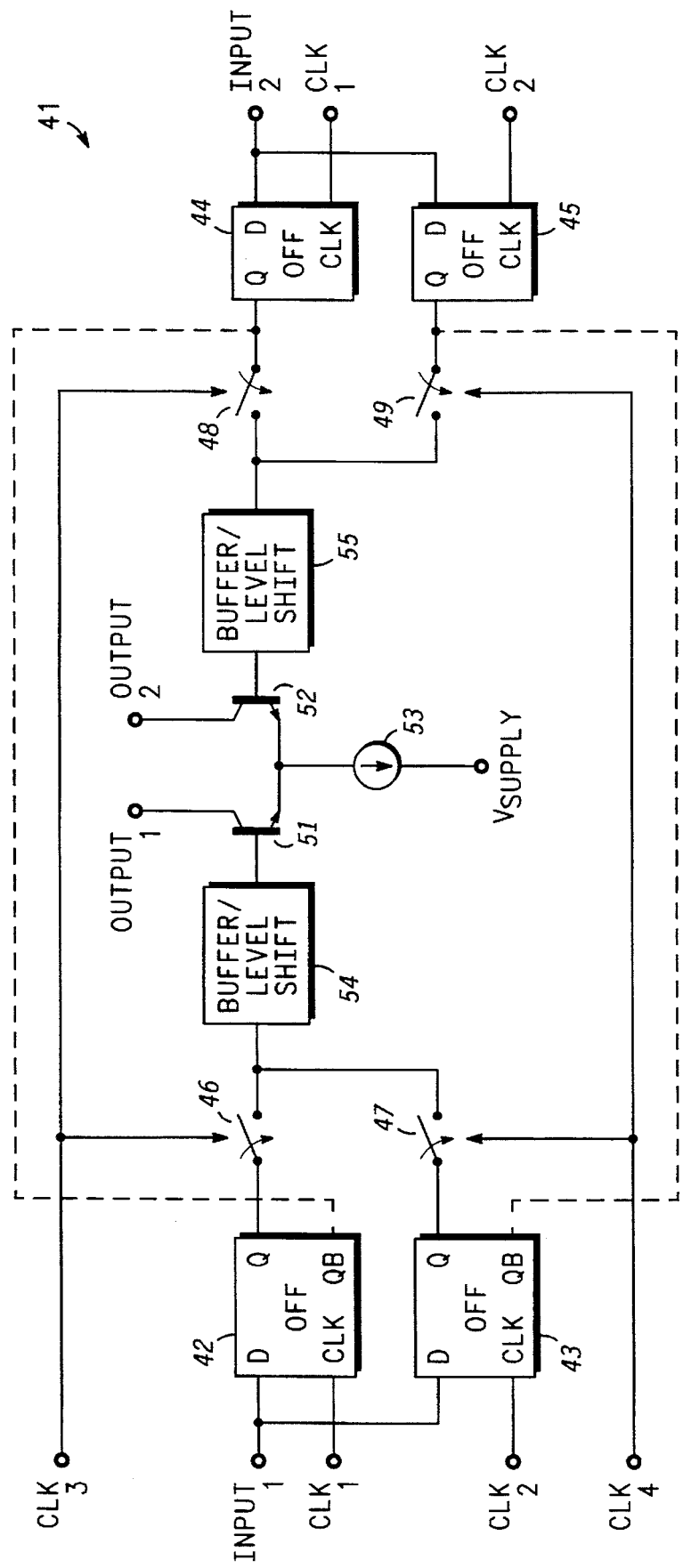
FIG. 4 is a schematic diagram of a current source that reduces noise spurs in accordance with the present invention.

FIG. 4 is a schematic diagram of a current source 41 for a DAC that reduces noise spurs or glitches in accordance with the present invention. Current source 41 includes an Input1, an Input2, a Clk1 input, a Clk2 input, a Clk3 input, a Clk4 input, an Output1, and an Output2. Current source 41 comprises a differential transistor pair (transistors 51 and 52), a current source 53, D-flip flops (DFF) 42–45, switches 46–49, and Buffer/Level Shift circuits 54 and 55.

In the preferred embodiment, transistors 51 and 52 are bipolar NPN transistors having a collector, a base, and an emitter respectively corresponding to a first electrode, a control electrode, and a second electrode. Other transistor types well known for forming differential transistor pairs such as Field Effect Transistors could also be used. Transistor 51 has the collector coupled to Output1. Transistor 52 has the collector coupled to Output2. Current source 53 provides a predetermined current. Current source 53 has a first terminal coupled to the emitters of transistors 51 and 52 and a second terminal coupled for receiving a power supply voltage. In general, current source 53 comprises a transistor that is biased by a stable reference voltage for providing a predetermined current. In a DAC application, current sources (such as current source 53) have ratioed conducting areas for providing ratioed currents, each current source is biased by the same reference voltage. A differential voltage applied across the bases of transistors 51 and 52 steer the current of current source 53 through one of the transistors of the differential transistor pair. For example, a positive voltage across the base of transistor 51 to the base of transistor 52 enables transistor 51 for providing the current of current source 53 to Output1. Conversely, a positive voltage across the base of transistor 52 to the base of transistor 51 enables transistor 52 for providing the current of current source 53 to Output2.

D-flip flop 42 and switch 46 sample and provide a voltage to Buffer/Level Shift circuit 54. D-flip flop 42 has a D-input coupled to Input1, a clock input coupled to the CLK1 input, and a Q output. Switch 46 has a first terminal coupled to the Q output of D-flip flop 42, a control terminal coupled to the Clk3 input, and a second terminal. D-flip flop 43 and switch 47 samples and provides a voltage to Buffer/Level Shift circuit 54. D-flip flop 43 has a D-input coupled to Input1, a clock input coupled to the Clk2 input, and a Q output. Switch 47 has a first terminal coupled to the Q output of D-flip flop 43, a control terminal coupled to the Clk4 input, and a second terminal coupled to the second terminal of switch 46. Buffer/Level Shift circuit 54 buffers a voltage provided through switches 46 and 47 and level shifts the voltage to a level suitable for operation of the differential transistor pair. Buffer/Level Shift circuit 54 has an input coupled the second terminal of switch 46 and an output coupled to the base of transistor 51. In the preferred embodiment, switches 46–49 are transmission gates or single transistors coupled for passing a signal from an input to a Buffer/Level Shift circuit when enabled by a control signal.

D-flip flop 44 and switch 48 sample and provide a voltage to Buffer/Level Shift circuit 55. D-flip flop 44 has a D-input coupled to Input2, a clock input coupled to the CLK1 input, and a Q output. Switch 48 has a first terminal coupled to the Q output of D-flip flop 44, a control terminal coupled to the CLK3 input, and a second terminal. D-flip flop 45 and switch 49 sample and provide a voltage to Buffer/Level Shift circuit 55. D-flip flop 45 has a D-input coupled to Input2, a clock input coupled to the CLK2 input, and a Q output. Switch 49 has a first terminal coupled to the Q output of D-flip flop 45, a control terminal coupled to the CLK4 input, and a second terminal coupled to the second terminal of switch 48. Buffer/Level Shift circuit 55 buffers a voltage provided through switches 48 and 49 and level shifts the voltage to a level suitable for operation of the differential transistor pair. Buffer/Level Shift circuit 55 has an input coupled the second terminal of switch 48 and an output coupled to the base of transistor 52.

Two flip flops are used to provide an input signal to a transistor of the differential transistor pair. Each flip flop alternately couples a stable voltage to the transistor via a switch. The flip flop not providing a voltage stores or samples the input signal thus eliminating a problem of waiting for the input signal to stabilize. The switches are enabled and disabled by clock signals. In a DAC, multiple current sources are used as shown in FIG. 1. In the preferred embodiment, each current source of a DAC is enabled or disabled simultaneously to provide an output current that is a sum of the enabled current sources. Switching stable voltages via a switch to each current source insures each current source rapidly provides a current or no current. Delay is minimized between current sources of the DAC by accurately controlling the clock signals enabling and disabling the switches. The time when each switch is open or closed should occurs simultaneously or with minimum delay to reduce voltage glitching.

Figure 5:
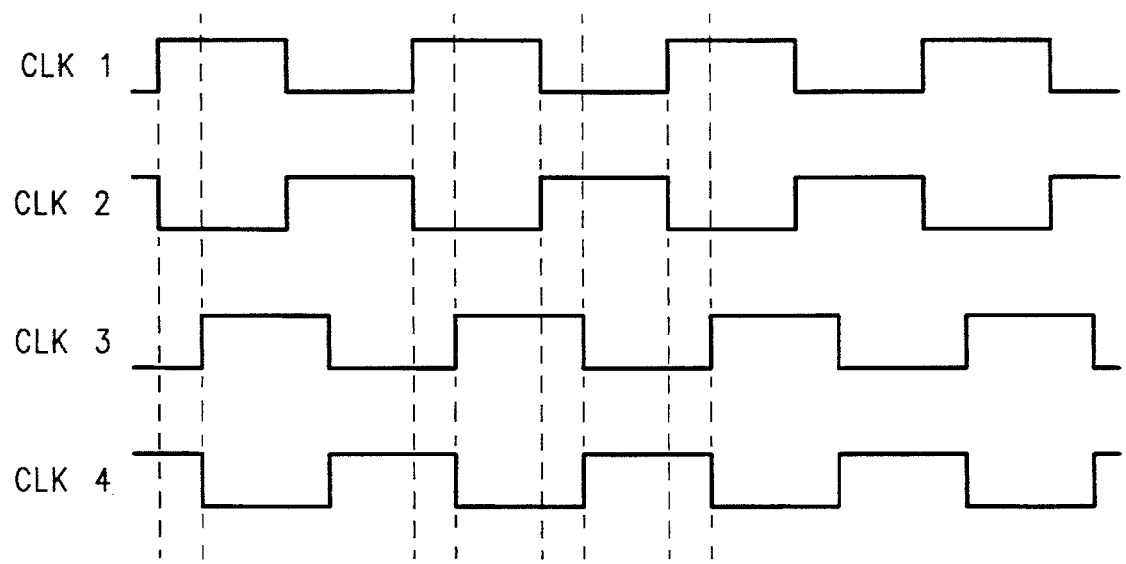
FIG. 5 is a timing diagram illustrating how the current source of FIG. 4 is clocked in accordance with the present invention.

Operation of current source 41 is explained using the schematic of FIG. 4 and the timing diagram of FIG. 5. FIG. 5 illustrates the clock signals Clk1, Clk2, Clk3, and Clk4 for clocking D-flip flops 42–45 and switches 46–49. Input signals applied to Input1 and Input2 are coupled to transistors 51 and 52 via flip flops and switches to produce a differential voltage across the differential transistor pair. The differential voltage enables either transistor 51 or 52 for respectively conducting a current from current source 53 to Output1 or Output2.

Prior art current sources for a DAC as described hereinabove reduce noise glitches by decoupling current sources from their corresponding inputs prior to an input signal transition. Parasitic capacitance holds previous input signal voltage levels to each current source for a predetermined time during a decoupling sequence. A timing generator circuit for opening and closing switches in each current source must insure all input signals have stabilized to their final levels over all wafer processing conditions, temperature conditions, and input signal conditions. After the predetermined time period, each current source is simultaneously coupled to their respective inputs having stabilized input voltages thereby reducing noise glitches. Leakage current can also be a problem by draining charge from the parasitic capacitance used to hold a voltage while the switches are opened.

Current source 41 eliminates the need for special timing conditions or parasitic capacitances for holding voltages. Current source 41 provides stabilized input signals by sampling and providing input signals via two memory elements at different times. Utilizing two memory elements allows an input voltage to be sampled and to stabilize while the other memory element provides a voltage signal to current source 41. Switches are used to couple either memory element to the differential transistor pair. Switch timing for opening and closing of the switches is controlled by simple clock signals that are easily coordinated with other current sources (not shown) to minimize noise glitches.

Current source 41 is a differential current source for steering a current from current source 53 to either Output1 or Output2. A differential current source is less susceptible to noise. Current source 41 can also be configured as a single ended current source due to the inherent symmetry of the circuit simply by eliminating half the circuit. D-flip flops 42 and 43 alternately provide a voltage from Input1 to Buffer/Level Shift circuit 54 via switches 46 and 47. Similarly, D-flip flops 44 and 45 alternately provides a voltage from Input2 to Buffer/Level Shift circuit 55 via switches 48 and 49. A differential voltage is provided across the bases of transistors 51 and 52 from Buffer/Level Shift circuits 54 and 55 that enables one of the transistors for conducting the current from current source 53. The Buffer/Level Shift circuits are not critical to the functional operation of current source 41 but provide buffering and also level shifting to maintain transistors 51 and 52 and current source 53 at optimum voltages for high speed operation.

Four clock signals: Clk1, Clk2, Clk3, and Clk4 are respectively applied to inputs Clk1, Clk2, Clk3, and Clk4 for controlling D-flip flops 42–45 and switches 46–49. In the preferred embodiment, the four clock signals operate at the same frequency. The clock signal Clk1 clocks D-flip flops 42 and 43. The clock signal Clk2 clocks D-flip flops 44 and 45. In the preferred embodiment, clock signals Clk1 and Clk2 are complementary clock signals. A logic level received at a D-input of a D-flip flop is stored in a slave section of the D-flip flop during a low portion of a clock signal. The logic level is shifted to a master section of the D-flip flop and output at a Q output during a high portion of the clock signal. Thus, the complementary clock signals clocking D-flip flops 42–45 store logic levels (at Input1 and Input2) in D-flip flops 42 and 43 while D-flip flops 44 and 45 output stored logic levels from a previous sample and vice versa.

Switches 46–49 control when each flip flop is coupled to the differential transistor pair of current source 41. The clock signal Clk3 enables and disables switches 46 and 48. The clock signal Clk4 enables and disables switches 47 and 49. In the preferred embodiment, a switch is opened or disabled when the controlling clock signal is low. The switch is closed or enabled when the controlling clock signal is high. The clock signals Clk3 and Clk4 are complementary signals. In the preferred embodiment, clock signals Clk1 and Clk2, and clock signals Clk3 and Clk4 are non-overlapping clock signals. The clock signal Clk3 is shifted or delayed from clock signal Clk1 by approximately one quarter of a clock cycle. For example, Clk1 transitions to a high logic level, approximately one quarter of a clock cycle later Clk3 transitions to a high logic level (see FIG. 5). The delay between the transition to a high logic level of Clk1 and Clk3 allow the Q outputs of D-flip flops 42 and 44 to shift a signal from the slave section to the master section of each flip flop, and stabilize before switches 46 and 48 close. Thus, when switches 46 and 48 close, stable voltages at the Q outputs of D-flip flops 42 and 44 are coupled to the differential transistor pair immediately switching the current from current source 53 to either Output1 or Output2. The clock signals (Clk1, Clk2, Clk3, and Clk4) would be coupled to each current source of a DAC which simultaneously switches all current sources thereby reducing noise glitches.

It should be noted that D-flip flops 42 and 44 provide complementary signals respectively to transistors 51 and 52. Similarly, D-flip flops 43 and 45 provide complementary signals respectively to transistors 51 and 52. It is well known that flip flops typically have complementary outputs. An alternate approach which eliminates the D-flip flops 44 and 45 is to provide the complementary signals for transistors 51 and 52 from the QB (see dashed lines of FIG. 4) outputs of D-flip flops 42 and 43. The QB output of D-flip flop 42 couples to the first terminal of switch 48 and the QB output of D-flip 43 couples to the first terminal of switch 49.

As mentioned previously, the clock signal Clk4 is the complement of Clk3. Switches 46 and 48 are never enabled simultaneously with switches 47 and 49 (they transition simultaneously, one closes while the other opens). The operation of D-flip flops 43 and 45, and switches 47 and 49 are similar to that described hereinabove. The clock signal Clk4 is shifted from clock signal Clk2 by approximately one quarter of a clock cycle. For example, Clk4 transitions to a high logic level approximately one quarter of a clock cycle after Clk2 transitions to a high logic level (see FIG. 5). The delay between the transition to a high logic level of Clk2 and Clk4 allow the Q outputs of D-flip flops 43 and 45 to shift a signal from the slave section to the master section of each flip flop (43, 45), and stabilize before switches 47 and 49 close. Thus, when switches 47 and 49 close, stable voltages at the Q outputs of D-flip flops 43 and 45 are coupled to the differential transistor pair immediately switching the current from current source 53 to either Output1 or Output2.

In the preferred embodiment, signals applied to Input1 and Input2 are synchronized with clock signals Clk1 and Clk2 to maximize the set up time of each flip flop. The data rate or the rate at which signals are applied to the differential transistor pair of current source 41 occurs at twice the frequency of clock signals Clk1, Clk2, Clk3, and Clk4 since data is provided twice during a single clock cycle. Alternate sampling and providing voltage to a current source simplifies timing issues, allows time for voltages to stabilize, and provides a simple means for simultaneously controlling a number of current sources to reduce noise glitches.

By now it should be appreciated that a switchable current source has been provided that reduces noise glitches due to delay differences in enabling and disabling current sources of a DAC. The switchable current source employs two memory elements for alternately storing and providing a control voltage to a current source. Switches are used to couple the memory elements to the current source. The opening and closing of the switches are delayed a predetermined time from the clocks used to clock the flip flops to insure the output voltage of the flip flops have stabilized. The clocking of the current source is easily extended to multiple current sources as used in a DAC to insure minimum time delay as the current sources are enabled and disabled from providing a current thereby reducing noise glitches.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A switchable current source for a Digital to Analog Converter (DAC) comprising:

a first flip flop having an input coupled to a first input of the switchable current source, a clock input coupled for receiving a first clock signal, and an output;

a second flip flop having an input coupled to said first input of the switchable current source, a clock input coupled for receiving a second clock signal, and an output;

a first switch having a first terminal coupled to said output of said first flip flop, a control terminal coupled for receiving a third clock signal, and a second terminal;

a second switch having a first terminal coupled to said output of said second flip flop, a control terminal coupled for receiving a fourth clock signal, and a second terminal coupled to said second terminal of said first switch;

a first transistor having a first electrode coupled to a first output of the switchable current source, a control electrode coupled to said second terminal of said first switch, and a second electrode; and a current source having a first terminal coupled to said second electrode of said first transistor and a second terminal coupled for receiving a power supply voltage.

2. The switchable current source as recited in claim 1 further including:

a third flip flop having an input coupled to a second input of the switchable current source, a clock input coupled for receiving said first clock signal, and an output;

a fourth flip flop having an input coupled to said first input of the switchable current source, a clock input coupled for receiving said second clock signal, and an output;

a third switch having a first terminal coupled to said output of said third flip flop, a control terminal coupled for receiving said third clock signal, and a second terminal;

a fourth switch having a first terminal coupled to said output of said fourth flip flop, a control terminal coupled for receiving said fourth clock signal, and a second terminal coupled to said second terminal of said third switch; and a second transistor having a first electrode coupled to a second output of the switchable current source, a control electrode coupled to said second terminal of said third switch, and a second electrode coupled to said first terminal of said current source.

3. The switchable current source as recited in claim 2 further including:

a first buffer/level shift circuit having an input coupled to said second terminal of said first switch and an output coupled to said control electrode of said first transistor; and a second buffer/level shift circuit having an input coupled to said second terminal of said third switch and an output coupled to said control electrode of said second transistor.

4. The switchable current source as recited in claim 2 wherein said first, second, third, and fourth clock signals have a same frequency.

5. The switchable current source as recited in claim 4 wherein said first and second clock signals are complementary clock signals such that said first and second flip flops alternately shift out data and said third and fourth flip flops alternately shift out data.

6. The switchable current source as recited in claim 5 wherein said third and fourth clock signals are complementary clock signals such that said first and second switches alternately open and close and said third and fourth switches alternately open and close.

7. The switchable current source as recited in claim 6 wherein data is shifted out of said first and third flip flops for generating a first differential voltage across said control electrodes of said first and second transistors as said second and fourth flip flops store voltages respectively from said first and second inputs of said switchable current source, said first differential voltage steering a current from said current source to either said first or second output of said switchable current source and wherein data is shifted out of said second and fourth flip flops for generating a second differential voltage across said control electrodes of said first and second transistors as said first and third flip flops store voltages respectively from said first and second inputs of said switchable current source, said second differential voltage steering said current from said current source to either said first or second output of said switchable current source.

8. The switchable current source as recited in claim 7 wherein said third and fourth clock signals are respectively delayed approximately one quarter of a clock cycle from said first and second clock signals which allows said first, second, third, and fourth switches to close one quarter of said clock cycle after data is output from either said first, second, third, and fourth flip flops.

9. The switchable current source as recited in claim 1 further including:
- a second transistor having a first electrode coupled to a second output of the switchable current source, a control electrode, and a second electrode coupled to said first terminal of said current source;
- a third switch having a first terminal coupled to a QB output of said first flip flop, a control terminal coupled for receiving said third clock signal, and a second terminal coupled to said control electrode of said second transistor; and
- a fourth switch having a first terminal coupled to a QB output of said second flip flop, a control terminal coupled for receiving said fourth clock signal, and a second terminal coupled to said control electrode of said second transistor.

10. A switchable current source for a Digital to Analog Converter (DAC) comprising:
- a first flip flop having an input coupled to a first input of the switchable current source, a clock input coupled for receiving a first clock signal, and an output;
- a second flip flop having an input coupled to said first input of the switchable current source, a clock input coupled for receiving a second clock signal, and an output;
- a first switch having a first terminal coupled to said output of said first flip flop, a control terminal coupled for receiving a third clock signal, and a second terminal;
- a second switch having a first terminal coupled to said output of said second flip flop, a control terminal coupled for receiving a fourth clock signal, and a second terminal coupled to said second terminal of said first switch;
- a third flip flop having an input coupled to a second input of the switchable current source, a clock input coupled for receiving said first clock signal, and an output;
- a fourth flip flop having an input coupled to said first input of the switchable current source, a clock input coupled for receiving said second clock signal, and an output;
- a third switch having a first terminal coupled to said output of said third flip flop, a control terminal coupled for receiving said third clock signal, and a second terminal;
- a fourth switch having a first terminal coupled to said output of said fourth flip flop, a control terminal coupled for receiving said fourth clock signal, and a second terminal coupled to said second terminal of said third switch;
- a first transistor having a first electrode coupled to a first output of the switchable current source, a control electrode coupled to said second terminal of said first switch, and a second electrode;
- a second transistor having a first electrode coupled to a second output of the switchable current source, a control electrode coupled to said second terminal of said third switch, and a second electrode coupled to said second electrode of said first transistor; and
- a current source having a first terminal coupled to said second electrode of said first transistor and a second terminal coupled for receiving a power supply voltage.

11. The switchable current source as recited in claim 10 further including:
- a first buffer/level shift circuit coupled between said second terminal of said first switch and said control electrode of said first transistor; and
- a second buffer/level shift circuit coupled between said second terminal of said third switch and said control electrode of said second transistor.

12. The switchable current source as recited in claim 11 wherein said first, second, third, and fourth clock signals have a same frequency.

13. The switchable current source as recited in claim 12 wherein said first and second clock signals are complementary clock signals such that said first and second flip flops alternately shift out data and said third and fourth flip flops alternately shift out data.

14. The switchable current source as recited in claim 13 wherein said third and fourth clock signals are complementary clock signals such that said first and second switches alternately open and close and said third and fourth switches alternately open and close.

15. The switchable current source as recited in claim 14 wherein data is shifted out of said first and third flip flops for generating a first differential voltage across said control electrodes of said first and second transistors as said second and fourth flip flops store voltages respectively from said first and second inputs of said switchable current source, said first differential voltage enabling either said first or second transistor for respectively coupling a current from said current source to either said first or second output of said switchable current source and wherein data is shifted out of said second and fourth flip flops for generating a second differential voltage across said control electrodes of said first and second transistors as said first and third flip flops store voltages respectively from said first and second inputs of said switchable current source, said second differential voltage enabling either said first or second transistor for respectively coupling said current from said current source to either said first or second output of said switchable current source.

16. The switchable current source as recited in claim 13 wherein said third and fourth clock signals are respectively delayed approximately one quarter of a clock cycle from said first and second clock signals which allows said first, second, third, and fourth switches to close one quarter of said clock cycle after data is output from either said first, second, third, and fourth flip flops.

17. A method for controlling current sources in a Digital to Analog Converter (DAC) for reducing noise glitches as the current sources are enabled and disabled to change a total current output by the DAC, the method comprising;

alternately providing a voltage for enabling and disabling a current source from at least two memory elements wherein one memory element provides said voltage to a current source while another memory element samples an input voltage for said current source: and delaying said voltage for enabling and disabling said current source by a predetermined time to allow said voltage to stabilize.

18. The method as recited in claim 17 further including a step of simultaneously coupling each voltage for enabling and disabling to each current source to change the total current output by the DAC.

* * * * *